United States Patent
Morimoto et al.

(10) Patent No.: US 6,639,409 B2
(45) Date of Patent: Oct. 28, 2003

(54) BATTERY VOLTAGE MEASUREMENT DEVICE

(75) Inventors: Naohisa Morimoto, Toyohashi (JP); Ichiro Maki, Yokohama (JP); Hirofumi Yudahira, Hamana-gun (JP)

(73) Assignees: Matsushita Electric Industrial Co., Ltd., Osaka (JP); Toyota Jidosha Kabushiki Kaisha, Aichi (JP)

( * ) Notice: Subject to any disclaimer, the term of this patent is extended or adjusted under 35 U.S.C. 154(b) by 60 days.

(21) Appl. No.: 10/000,911

(22) Filed: Nov. 2, 2001

(65) Prior Publication Data

US 2002/0075015 A1 Jun. 20, 2002

(30) Foreign Application Priority Data

Nov. 2, 2000  (JP) .......................................... 2000-336781

(51) Int. Cl.[7] .............................................. G01R 31/36
(52) U.S. Cl. ...................... 324/434; 324/73.1; 324/771; 324/649
(58) Field of Search ................................ 324/434, 73.1, 324/522, 771, 439, 649

(56) References Cited

U.S. PATENT DOCUMENTS

| 5,712,568 A | 1/1998 | Flohr et al. ................... 324/434 |
| 5,914,606 A | 6/1999 | Becker-Irvin ................... 324/434 |
| 6,362,627 B1 * | 3/2002 | Shimamoto et al. ........ 324/434 |

FOREIGN PATENT DOCUMENTS

| JP | 11-248755 | 9/1999 |
| JP | 11-248756 | 9/1999 |
| JP | 11-248757 | 9/1999 |

* cited by examiner

Primary Examiner—N. Le
Assistant Examiner—Vincent Q. Nguyen
(74) Attorney, Agent, or Firm—Snell & Wilmer, LLP

(57) ABSTRACT

A battery voltage measurement device includes: a plurality of first switching sections, wherein each pair of adjacent first switching sections sequentially selects two output terminals of each of a plurality of battery blocks included in a battery pack so that each of the selected output terminals are connected to one of a pair of conductor wires; a voltage detection section for detecting a battery voltage of each of the plurality of battery blocks via the pair of conductor wires; and second switch sections each being provided on a respective one of the pair of conductor lines and being serially connected to each group of the plurality of first switch sections connected in parallel to one of the pair of conductor lines.

10 Claims, 4 Drawing Sheets

PRIOR ART

BATTERY VOLTAGE MEASUREMENT DEVICE

BACKGROUND OF THE INVENTION

1. Field of the Invention

The present invention relates to a battery voltage measurement device for measuring a voltage of stacked rechargeable batteries (a battery pack) which is mounted in an apparatus driven by the rechargeable batteries, such as an electric vehicle or the like.

2. Description of the Related Art

As a low-pollution vehicle designed for the purpose of solving environmental problems and energy problems, an electric vehicle such as an HEV (hybrid electric vehicle) and a PEV (pure electric vehicle) has received a great deal of attention up to the present. The electric vehicle has rechargeable batteries mounted therein, and the electric power of the rechargeable batteries drives an electric motor so as to run the electric vehicle. The electric vehicle has a high-voltage circuit for driving the electric motor and a low-voltage circuit for driving various electronic devices such as acoustic equipment, lighting devices, and an electronic controller (e.g., ECU; electronic control unit). The high-voltage circuit includes an inverter for driving an electric motor, and the inverter controls and drives the electric motor.

In a battery control section of such an electric vehicle, in order to obtain an output state of the rechargeable batteries which stably supplies electric power to the electric motor, it is necessary to use a battery voltage measurement device to accurately measure a battery voltage of each battery block of the battery pack.

Figure 4:
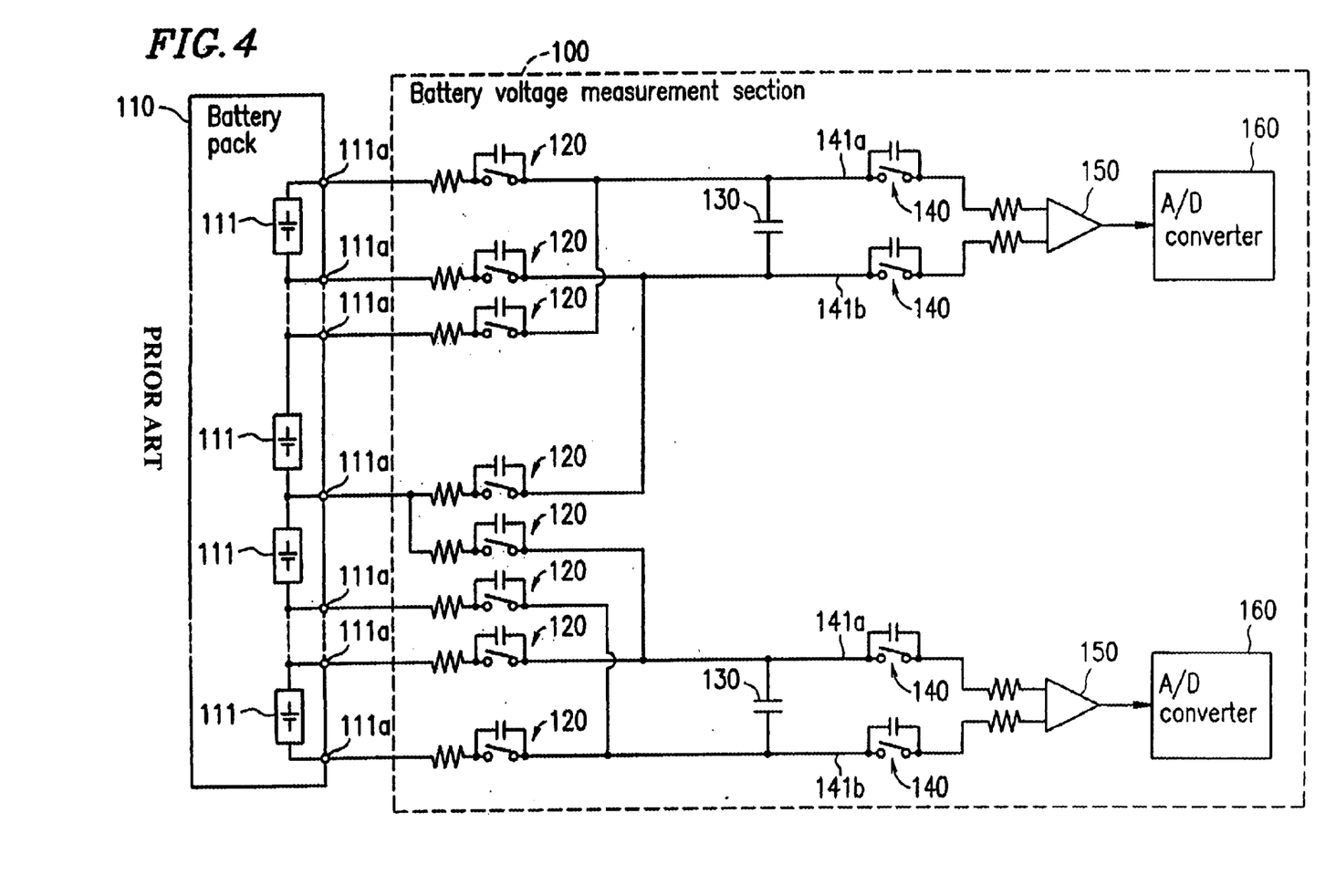
FIG. 4 is a circuit diagram illustrating an exemplary structure of a conventional battery voltage measurement device.

FIG. 4 is a circuit diagram illustrating an exemplary structure of a conventional battery voltage measurement device 100. In FIG. 4, the battery voltage measurement device 100 includes: a plurality of switches 120 in which each pair of adjacent switches 120 sequentially selects two corresponding output terminals 111a of a battery block 111 included in a battery pack 110; a capacitor 130 for storing (copying) a designated battery voltage; switches 140 for selectively applying the battery voltage stored in the capacitor 130 to a differential amplifier 150; the differential amplifier 150 for differentially amplifying the stored battery voltage which is input thereto via the switches 140; and an A/D converter 160 for performing an A/D conversion of the voltage output from the differential amplifier 150.

The battery pack 110 includes a plurality of serially-connected battery blocks 111. A value of a voltage output from one battery block 111 (battery module) is, for example, about DC 20 V. The maximum value of a voltage output from all of the serially-stacked battery blocks 111 is about DC 400 V.

Each pair of adjacent switches 120 is connected to the two corresponding output terminals 111a of each of the plurality of battery blocks 111.

The capacitor 130 has electrodes connected to a pair of conductor lines 141a and 141b laid between the switches 120 and the switches 140. The capacitor 130 temporarily stores a battery voltage of each of the battery blocks 111, which is transferred via two designated switches 120 to the capacitor 130.

Each of the switches 140 is connected to one of the two input terminals of the differential amplifier 150 and serves to connect the differential amplifier 150 to the capacitor 130 or disconnect the differential amplifier 150 from the capacitor 130. On/Off control of the plurality of switches 120 and the switches 140 is performed by a switching controller (not shown), e.g., a microcomputer.

With the above-described structure, at first, in order to store (copy) a battery voltage of a first battery block 111 in (into) the capacitor 130, each of the switches 120 connected to one of the two output terminals 111a of the first battery block 111 is turned on. At this time, the switches 140 are turned off to disconnect the capacitor 130 from both of the two input terminals of the differential amplifier 150.

Next, all the switches 120 are turned off to disconnect the capacitor 130 from all of the battery blocks 111, and then the switches 140 are turned on so as to input the battery voltage of the first battery block 111, which is stored in the capacitor 130, to the differential amplifier 150. Data corresponding to the battery voltage differentially-amplified, for example, from DC 20 V to DC 5 V in an input voltage range of the A/D converter 160, by the differential amplifier 150 is A/D-converted by the A/D converter 160. The A/D-converted battery voltage data is read by, for example, a microcomputer (not shown) in a subsequent stage.

However, in the conventional battery voltage measurement device 100, in the case where the battery voltage of the designated battery block 111 is stored in the capacitor 130 and all of the switches 120 are turned off at the time of measuring the battery voltage, when the switches 140 are turned on, a voltage of up to approximately DC 400 V is applied to the plurality of switches 120 which are turned off. Thus, the plurality of switches 120 are required to withstand a voltage of DC 400 V or more. Accordingly, the plurality of switches 120 are required to be large-sized expensive switches which withstand a high voltage and the number of those switches is required to be at least as many as the number of all the output terminals of the battery blocks 111.

SUMMARY OF THE INVENTION

According to one aspect of the present invention, a battery voltage measurement device includes: a plurality of first switching sections, in which each pair of adjacent first switching sections sequentially selects two output terminals of each of a plurality of battery blocks included in a battery pack so that each of the selected output terminals are connected to one of a pair of conductor wires; a voltage detection section for detecting a battery voltage of each of the plurality of battery blocks via the pair of conductor wires; and second switch sections each being provided on a respective one of the pair of conductor lines and being serially connected to each group of the plurality of first switch sections connected in parallel to one of the pair of conductor lines.

With the above-described structure, by providing the series circuit in which the plurality of the first switching sections are connected to the second switching sections, the voltage of up to approximately DC 400 V applied to the first and second switching sections being in an off state, is applied to the first and second switching sections as voltages divided by the respective parasitic capacitance of the first and second switching sections being in an off state, so that the voltage applied to the first and second switching section can be lowered. Thus, small-sized inexpensive switches only required to withstand a voltage which is lower than that conventionally-required to withstand can be used as the first and second switching sections. Although the first switching sections are conventionally required to withstand a voltage of DC 400 V or more, by equalizing the respective parasitic capacitance of the first and second switching sections, a voltage which the first and second switching sections are required to withstand can be lowered to approximately DC 200 V. Moreover, by controlling the parasitic capacitance of the first and second switching sections, a voltage which the first switching sections are required to withstand can be lowered and an electric circuit of the voltage measurement section can be structured (as an IC chip) using a conventional IC process.

According to one embodiment of the invention, the battery voltage measurement device may further include: a capacitance section laid between the pair of conductor lines for selectively storing a battery voltage of each of the battery blocks via the first and second switching sections; and a third switching section for selectively applying the battery voltage stored in the capacitance section to the voltage detection section, in which the voltage detection section may detect the battery voltage stored in the capacitance section via the third switching section.

With the above-described structure, by providing the series circuit in which the first switching sections are connected to the second switching sections, in the case where a battery voltage of a designated battery block is stored in a capacitor section and thereafter all of the first and second switching sections are turned off, at the time of measuring the battery voltage, when the third switching sections are turned on, a voltage of up to approximately DC 400 V of a battery pack is divided by parasitic capacitance of the first and second switching sections being in an off state and is applied to the first and second switching sections, so that the voltage applied to the plurality of first and second switching sections can be lowered. Thus, small-sized inexpensive switches only required to withstand a voltage which is lower than that conventionally-required to be withstood can be used as the first and second switching sections. Although the first switching sections are conventionally required to withstand a voltage of DC 400 V or more, by equalizing the respective parasitic capacitance of the first and second switching sections, a voltage which the first and second switching sections are required to withstand can be lowered to approximately DC 200 V.

According to another embodiment of the invention, the third switching section may include a plurality of serially-connected switching sections.

With the above-described structure, by providing the third switching sections including a plurality of serially-connected switches, when the third switching sections are turned off and the designated first switching sections and the second switching sections serially connected thereto are turned on so as to store a battery voltage of a designated battery block in the capacitor section, the voltage of up to approximately DC 400 V of the battery pack is divided by parasitic capacitance of the plurality of serially-connected switches (the third switching sections) and is applied to each of the third switching sections, so that each voltage applied to the plurality of serially-connected switches (the third switching sections) can be lowered. Thus, small-sized inexpensive switches only required to withstand a voltage which is lower than that conventionally-required to be withstood can be used as the third switching sections. Moreover, an IC chip including the third switching sections can be manufactured using a conventional IC process.

According to still another embodiment of the invention, the second switching section may be one switch or may include a plurality of serially-connected switches.

With the above-described structure, small-sized inexpensive switches only required to withstand a voltage which is lower than that conventionally-required to be withstood can be used as the first switching sections. Specifically, by providing two sets of the second switching sections serially connected to the first switching sections, the two sets of the second switching sections are only required to withstand a voltage of approximately DC 200 V, and by providing four sets of the second switching sections serially connected to the first switching sections, the four sets of the second switching sections are only required to withstand a voltage of approximately DC 100 V. approximately DC 80 V. By further lowering a voltage which the first switching sections are required to withstand, existing semiconductor switches can be used as the first switching sections, and an IC chip including the first switching sections can be readily manufactured using a conventional IC process.

According to still another embodiment of the invention, a relationship between a parasitic capacitance Ca of the plurality of first switching sections connected in parallel to the pair of conductor lines and a parasitic capacitance Cb of the second switching sections may be represented by $Ca \geq Cb$.

With the above-described structure, when the relationship between the parasitic capacitance of groups of switches is represented by Cb<Ca, since the number of the first switching sections is considerably greater than that of the second switching sections, a voltage applied to the first switching sections can be lower than that applied to the second switching sections, whereby it is possible to lower a voltage withstanding requirement of the first switching sections, the number of which is greater than that of the second switching sections.

According to still another embodiment of the invention, the battery voltage measurement device further includes overvoltage prevention sections each being connected to a respective one of the pair of conductor lines, which serially connect the first switching sections to the second switching sections, in a forward direction from two output terminals of a designated battery block.

With the above-described structure, a voltage is applied from an output terminal of a designated battery block to a pair of conductor lines laid between serially-connected switches, so that a voltage clamp function of the rectifier sections which prevents a voltage from being excessive with respect to a voltage withstanding requirement of the switches can be attained.

According to another aspect of the present invention, a battery voltage measurement device includes: a battery pack including a plurality of battery blocks; a plurality of first switching sections, wherein each pair of adjacent first switching sections sequentially selects two output terminals of each of the plurality of battery blocks so that each of the selected output terminals are connected to a respective one of a pair of conductor wires; a voltage detection section for detecting a battery voltage of each of the plurality of battery blocks via the pair of conductor wires; and second switch sections each being provided on a respective one of the pair of conductor lines and being serially connected to each group of the plurality of first switch sections connected in parallel to one of the pair of conductor lines.

According to one embodiment of the invention, the battery voltage measurement device may further include: a capacitance section laid between the pair of conductor lines for selectively storing a battery voltage of each of the battery blocks via the first and second switching sections; and a third switching section for selectively applying the battery voltage stored in the capacitance section to the voltage detection section, in which the voltage detection section detects the battery voltage stored in the capacitance section via the third switching section.

According to another embodiment of the invention, the third switching section may include a plurality of serially-connected switching sections.

According to still another embodiment of the invention, the second switching section may include a plurality of serially-connected switching sections.

According to still another embodiment of the invention, a relationship between a parasitic capacitance Ca of the plurality of first switching sections connected in parallel to the pair of conductor lines and a parasitic capacitance Cb of the second switching sections may be represented by Ca≧Cb.

According to still another embodiment of the invention, the battery voltage measurement device may further include overvoltage prevention sections each being connected to a respective one of the pair of conductor lines, which serially connect the first switching sections to the second switching sections, in a forward direction from two output terminals of a designated battery block.

Thus, the invention described herein makes possible the advantages of providing a battery voltage measurement device which can lower a voltage withstanding requirement of switches, so that small-sized inexpensive switches can be used.

These and other advantages of the present invention will become apparent to those skilled in the art upon reading and understanding the following detailed description with reference to the accompanying figures.

DESCRIPTION OF THE PREFERRED EMBODIMENTS

Hereinafter, examples of a battery voltage measurement device according to the present invention which is applied to an electric circuit for driving an electric vehicle will be described, and thereafter, a voltage measurement section which is a feature of the present invention will be described in detail.

Figure 1:
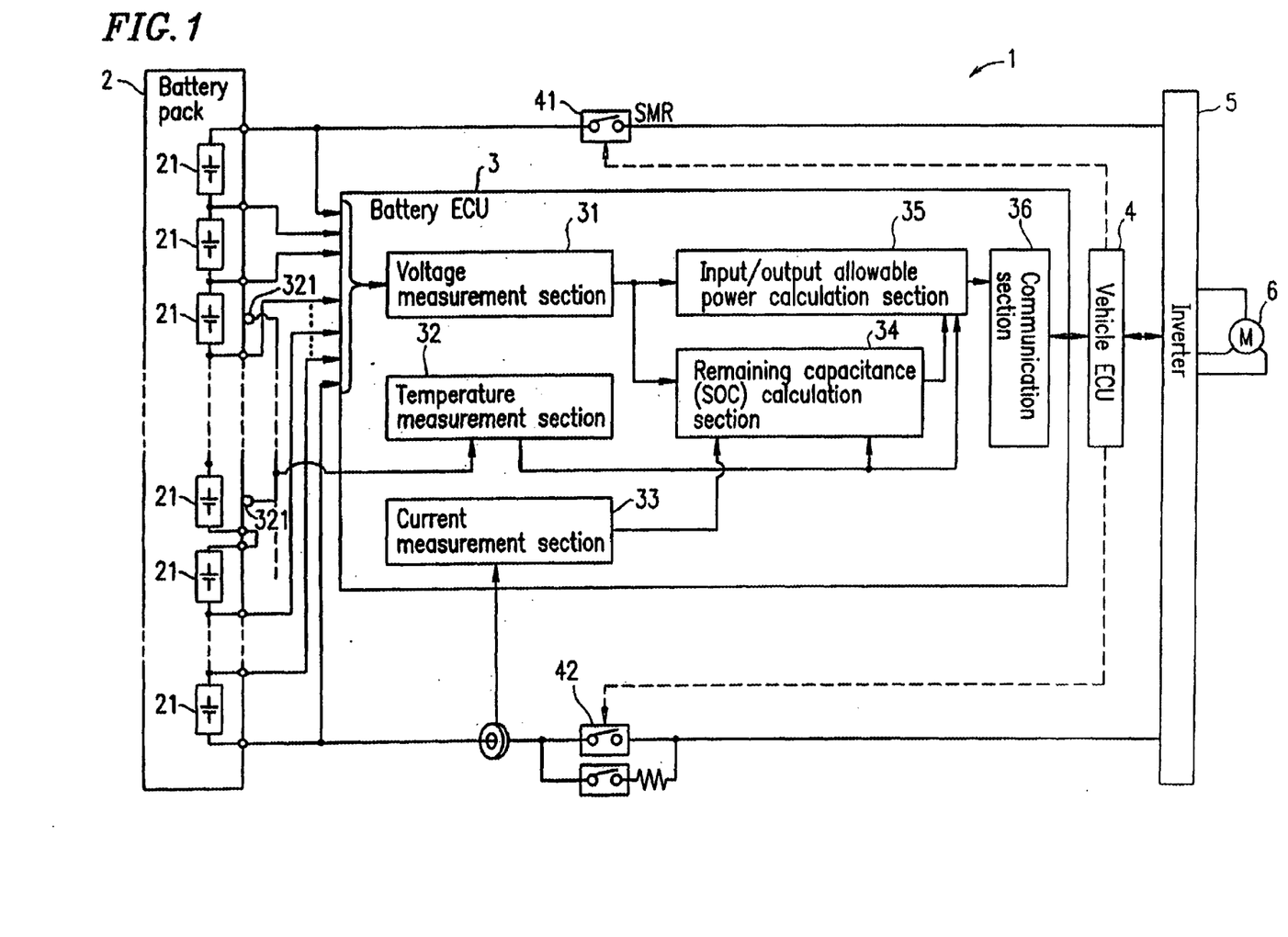
FIG. 1 is a schematic block diagram illustrating a structure of an electric circuit for driving an electric vehicle according to an example of the present invention.

FIG. 1 is a schematic block diagram illustrating a structure of an electric circuit I for driving an electric vehicle according to an example of the present invention. In FIG. 1, the electric circuit 1 for driving an electric vehicle includes: a battery pack 2 as a power supply source; a battery ECU (battery electronic control unit) 3 for controlling an output of the battery pack 2 by obtaining a particular state of the battery pack 2 (e.g., a battery remaining capacitance; SOC); a vehicle ECU (vehicle electronic control unit) 4 for controlling components of the electric vehicle; an inverter 5 for converting a battery voltage from the battery pack 2 into a prescribed three-phase high voltage; and an electric motor 6 for rotating an axle of the electric vehicle (not shown), for example, by a three-phase high voltage power from the inverter 5.

The battery pack 2 (which is also called a "primary battery" or "main battery") includes a plurality of serially-connected battery blocks 21 (each of the battery blocks 21 includes a plurality of battery cells). A value of a voltage output from each of the battery blocks 21 is, for example, DC 20 V. The maximum value of a voltage output from all of the battery blocks 21 is about DC 400 V.

The battery ECU 3 includes a voltage measurement section 31, a temperature measurement section 32, a current measurement section 33, a remaining capacitance (SOC) calculation (or detection) section 34, an input/output allowable power calculation section 35, and a communication section 36.

The voltage measurement section 31 measures a battery voltage of each of the battery blocks 21 of the battery pack 2.

The battery pack 2 includes a plurality of temperature sensors 321 provided in suitable places for reliable temperature sensing. The temperature measurement section 32 measures, based on a sensor output from the temperature sensor 321, a battery temperature at each place where the temperature sensors 321 are located, which varies due to heat generated by the battery pack 2.

The current measurement section 33 detects a battery current flowing through a closed circuit between the battery pack 2 and the inverter 5 in a magnetic compensation manner (or in a shunt resistance manner).

The remaining capacitance detection section 34 detects a remaining capacitance SOC of each of the battery blocks 21 based on a measurement battery voltage value measured for each battery block 21, a measurement current value measured by the current measurement section 33, and a measurement battery temperature value measured by the temperature measurement section 32.

The input/output allowable power calculation section 35 receives data representing the measurement battery voltage value measured for each battery block 21, the measurement battery temperature value, and a value of the remaining capacitance SOC. The input/output allowable power calculation section 35 calculates, for example, an output allowable power representing how much electric power a vehicle can output at present or an input allowable power representing how much electric power is regenerated in a vehicle at present.

The communication section 36 transmits the input/output allowable power information to the vehicle ECU 4.

The vehicle ECU 4 detects, for example, an ignition key IG being turned on and turns on switches 41 and 42, so that the battery power from the battery pack 2 is input to the inverter 5. For example, when a measurement battery temperature is extremely high, the vehicle ECU 4 suppresses an output from the inverter 5, according to an input/output allowable power value output from the input/output allowable calculation section 35, until the battery temperature falls to a prescribed battery temperature (e.g., 60° C. or lower).

The voltage measurement section 31 which is a feature of the present invention will be described in detail below.

Figure 2:
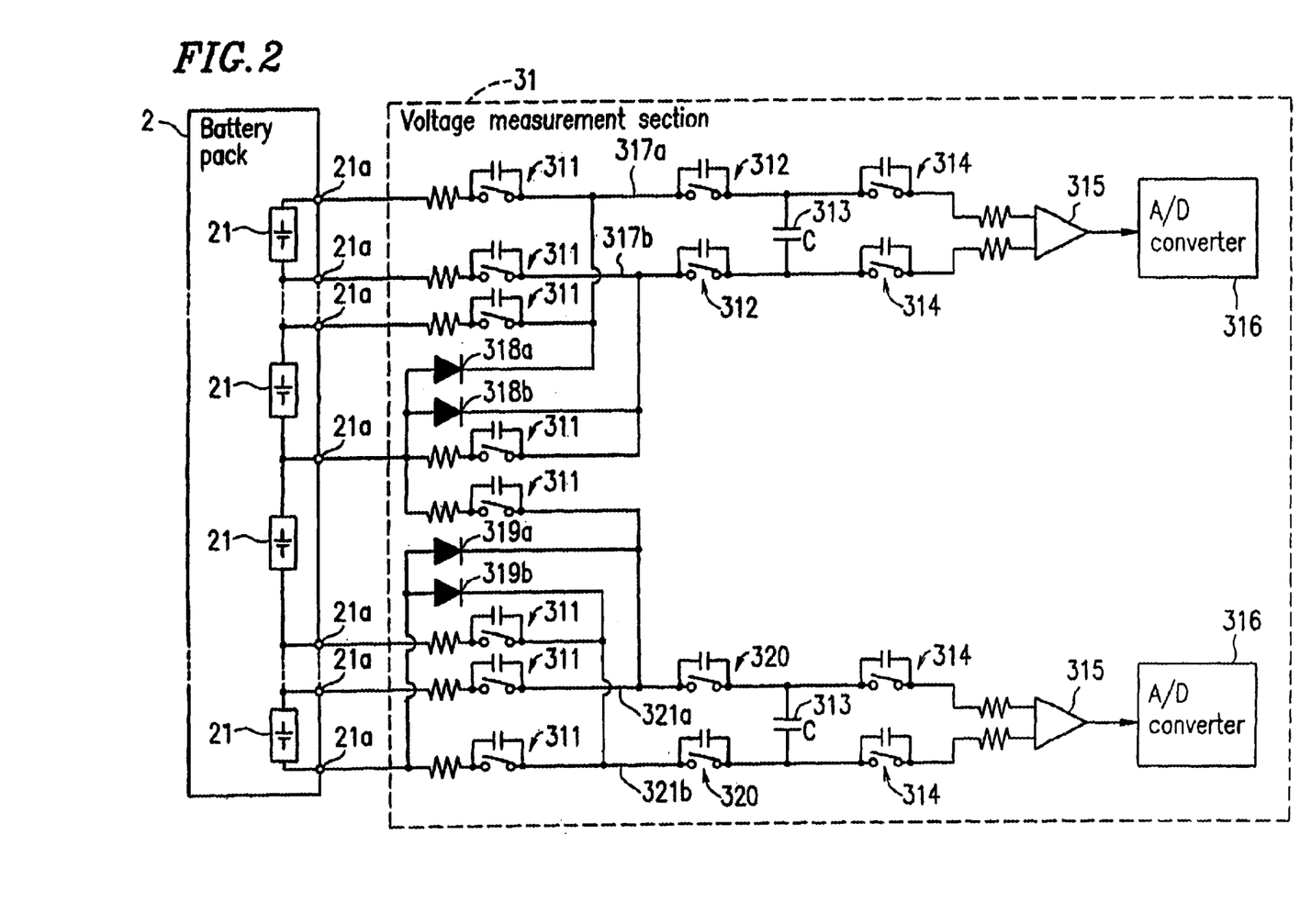
FIG. 2 is a circuit diagram illustrating an exemplary structure of a battery pack and a voltage measurement section of FIG. 1.

FIG. 2 is a circuit diagram illustrating an exemplary structure of the battery pack 2 and the voltage measurement section 31 of FIG. 1. The circuit of the voltage measurement section 31 illustrated in FIG. 2 has a structure which can be divided into two circuit groups (upper and lower circuit groups) at an output terminal 21a of the battery pack 2 from which a voltage of DC 200 V (i.e., the midpoint of a voltage of up to DC 400 V) is output in terms of timing of a voltage measurement. Only the upper circuit group is described herein.

In FIG. 2, the voltage measurement section 31, which is a component of a battery voltage measurement device, includes: a plurality of switches 311 (first switching sections) in which each pair of adjacent switches 311 selects two corresponding output terminals 21a of each of the battery blocks 21 included in the battery pack 2; switches 312 (second switching sections) serially connected to the switches 311; a capacitor 313 (capacitance section) for storing a battery voltage of each of the battery blocks 21; and switches 314 (third switching sections) for selectively applying the battery voltage stored in the capacitor 313 to a differential amplifier 315.

The voltage measurement section 31 further includes: the differential amplifier 315 (gain adjustment section) for differentially amplifying the battery voltage (e.g., DC 20 V as a potential difference) input thereto via the switch 314 from the capacitor 313 to the differential amplifier 315 so as to be within DC 5 V of a dynamic range of an A/D converter 316; and the A/D converter 316 for performing an A/D conversion of a voltage output from the differential amplifier 315. Digital data obtained by measuring the voltage using the A/D converter 316 is read by a microcomputer (not shown), etc., in a subsequent stage.

Moreover, the voltage measurement section 31 includes diodes 318a and 318b (rectifier sections) used as overvoltage prevention sections for preventing a voltage from being excessive. The diodes 318a and 318b are respectively connected to a pair of conductor lines 317a and 317b which are laid between the switches 311 and the switches 312, in a forward direction from two output terminals 21a of the designated battery block 21.

Each of the plurality of switches 311 is connected to one of the output terminals 21a of the plurality of battery blocks 21 at one end and is connected at the other end to either of the pair of conductor lines 317a and 317b which are connected to each of the battery blocks 21.

One of the two switches 312 is serially connected via the conductor line 317a to the plurality of switches 311 connected in parallel to one another. Similarly, the other of the two switches 312 is serially connected via the conductor line 317b to the plurality of switches 311 connected in parallel to one another. In this manner, by serially connecting the plurality of switches 311, which are connected in parallel to one another, to one of the two switches 312, the voltage of up to approximately DC 400 V of the battery pack 2 can be measured as an applied voltage which is divided at the ratio of the parasitic capacitance Ca of the plurality of switches 311, which are connected to one another, to the parasitic capacitance Cb of the switches 312. For example, in the case of Ca=Cb, the voltage of up to approximately DC 400 V stored in the capacitance 313 can be divided into two applied voltages, each being approximately DC 200 V.

The capacitor 313 temporarily stores a battery voltage applied via two designated switches 312 from two output terminals 21a of each of the battery blocks 21.

Each of two output terminals (output side) of the switches 314 is connected to one of two input terminals of the differential amplifier 315 and used for connection or disconnection between the two input terminals of the differential amplifier 315 and two electrodes of the capacitor 313. On/Off control of the plurality of switches 311, 312, and 314 is performed by a switching control section (not shown), e.g., a microcomputer.

With the structure described above, an operation of the voltage measurement section 31 is described below. Referring to FIG. 1, the ignition switch IG (not shown) is turned on so as to drive the vehicle ECU 4, and the switches 41 and 42 connected to output terminals at both ends of the battery pack 2 are turned on, so that electric power from the battery pack 2 is supplied to the inverter 5. The inverter 5 converts the electric power from the battery pack 2 into a three-phase high voltage and supplies it to the electric motor 6. The electric motor 6 rotates an axle of the vehicle so as to run the vehicle.

Referring to FIG. 2, when an output battery voltage of each of the battery blocks 21 is measured, in order to store a battery voltage of a first battery block 21 in the capacitor 313, each of two of the switches 311 and the switches 312 connected to one of two corresponding output terminals 21a of the first battery block 21 are turned on (while the other switches 311 remain off). In the meantime, the switches 314 are turned off to disconnect electrodes of the capacitor 313 from input terminals of the differential amplifier 315.

Next, all of the switches 311 are turned off to disconnect the capacitor 313 from all of the battery blocks 21, and then the switches 314 are turned on to input the battery voltage of the first battery block 21, which is stored in the capacitor 313, to the differential amplifier 315. The battery voltage is differentially-amplified (for a gain adjustment or a voltage adjustment) by the differential amplifier 315 and the differentially-amplified voltage is A/D-converted by the A/D converter 316. The A/D-converted battery voltage data is read by a controller (not shown), e.g., a microcomputer.

In this battery voltage measurement, after the battery voltage of the designated battery block 21 is stored in the capacitor 313 and all of the switches 311 and the switches 312 are turned off, when the switches 314 are turned on so as to read the battery voltage stored in the capacitor 313, if the parasitic capacitance Ca of the plurality of switches 311, which are connected in parallel to one another, is equal to the parasitic capacitance Cb of the switches 312, the battery voltage applied to the designated battery block 21 is divided into two voltages which are applied to the switch 311 and the switch 312, respectively.

That is, in the voltage measurement section 31, by serially connecting the two switches 312 (a group b of switches, only one group in the example of the present invention) to two groups a of switches (i.e., the plurality of switches 311), which are connected in parallel to one another, respectively, it is possible to divide a voltage of up to approximately DC 400 V, which is conventionally applied directly to the group a switches (the switches 311), into two voltages each being applied to the group a switches and the group b switches. The ratio of the division (voltage division) can be freely determined by the ratio of the parasitic capacitance Ca of the group a switches to the parasitic capacitance Cb of the group b switches or by further subdividing the voltage measurement section 31. In this example of the present invention, only one half of the voltage measurement section 31 is described for the purpose of a brief description of the division of the applied voltage. However, the operation of the other half of the voltage measurement section 31 is the same.

Figure 3:
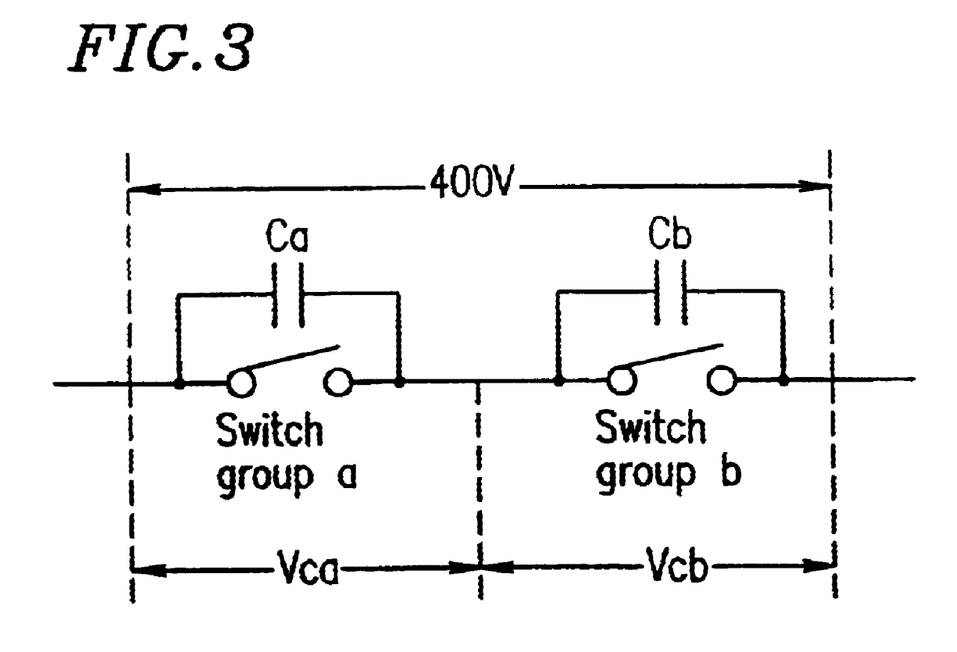
FIG. 3 is a diagram illustrating a division of a voltage applied to each serially-connected switch of FIG. 2.

When a voltage applied to the group a switches, which are in an off state, is represented by Vca and a voltage applied to the group b switches, which are in an off state, is represented by Vcb, in a series circuit including the parasitic capacitance Ca of the group a switches and the parasitic capacitance Cb of the group b switches to which a voltage of DC 400 V is applied as illustrated in FIG. 3, two voltages Vca and Vcb obtained by the voltage division, which are applied to the group a switches and the group b switches, respectively, are represented by:

$$Vca=400\times\{Cb/(Ca+Cb)\}$$
$$Vcb=400\times\{Ca/(Ca+Cb)\}.$$

Accordingly, when the relationship between the parasitic capacitance of the group a switches and the group b switches is represented by Cb<Ca, since the number of the switches (the plurality of switches 311 connected in parallel to one another) included in the group a is considerably greater than that of the switches included in the group b (the switches 312), the voltage applied to the group a switches can be lower than that applied to the group b switches, whereby it is possible to lower a voltage withstanding requirement of the group a switches in which the number of the switches included therein is greater than that of the switches included the group b. In this case, by adjusting the parasitic capacitance Ca of the plurality of switches 311 connected in parallel to one another so as to be equal to the parasitic capacitance Cb of the switches 312, even if the voltage applied to the plurality of switches 311 and the switches 312 is maximum (i.e., DC 400 V), as described above, the voltage which the plurality of switches 311 and the switches 312 are required to withstand is a half of the DC 400 V, i.e., DC 200 V.

As described above, according to the example of the present invention, by providing the series circuit in which the plurality of switches 311 connected in parallel to one another are connected to the switches 312, the voltage of up to approximately DC 400 V applied to the switches 311 and 312 being in an off state, is applied to the switches 311 and 312 as voltages divided by the respective parasitic capacitance of the switches 311 and 312 being in an off state, so that the voltage applied to the plurality of switches 311 connected in parallel to one another and the switches 312 can be lowered. Thus, small-sized inexpensive switches only required to withstand a voltage which is lower than that conventionally-required to be withstood can be used as the switches 311 and 312.

Moreover, although the switches 311 and 312 are conventionally required to withstand a voltage of DC 400 V or more, by equalizing the respective parasitic capacitance of the switches 311 and 312, a voltage which the switches 311 and 312 are required to withstand can be lowered to DC 200 V or more. In this manner, by lowering a voltage applied to the switches 311 and 312, small-sized inexpensive switches only required to withstand a voltage which is lower than that conventionally-required to be withstood can be used as the switches 311 and 312.

Moreover, by controlling the parasitic capacitance of the switches 311 and 312 as explained above, a voltage which the switches 311 are required to withstand can be lowered and an electric circuit of the voltage measurement section 31 can be structured (as an IC chip) using a conventional IC process.

Moreover, by connecting the output terminal 21a to which an intermediate potential difference of the battery pack 2 is applied via the diodes 318a and 318b as the rectifier sections to a pair of conductor lines 317a and 317b, respectively, which are laid between the switches 311 and 312, a clamp function for preventing a voltage from being greater (DC 200 V or more) than the switches 311 and 312 can withstand can be obtained.

The above example of the present invention has been described for the case where the battery voltage measurement device of the present invention is applied to an electric vehicle. However, the present invention is not limited to such a case, the battery voltage measurement device of the present invention can be applied to any equipment so long as the equipment is driven using electric power of the battery pack 2 including the plurality of battery blocks 21. In such a case, similar effects to those of the example of the present invention can be attained.

In the above example of the present invention, the battery voltage measurement section 31 includes the switches 312 each serially connected to the plurality of switches 311. However, the battery voltage measurement section 31 of the present invention is not limited to such switches 312. The switches 312 may be a series circuit including two or more switches serially connected to the plurality of switches 311. In this case, by serially connecting the plurality of switches 311 to, for example, four to nine serially-connected switches (only one switch 312 in the above-described example), a voltage of up to DC 400 V is divided into 5 to 10 voltages separately applied to the switches 311 and 312, the voltage applied to one switch is between approximately DC 40 V and approximately DC 80 V. Accordingly, if the switches 311 and 312 are only required to withstand a voltage of between approximately DC 40 V and approximately DC 80 V, existing semiconductor switches can be used as the switches 311 and 312, and an IC chip including the switches 311 and 312 can be readily manufactured using a conventional IC process.

In the above example of the present invention, the battery voltage measurement section 31 includes the switches 314 each serially connected to the switch 312. However, the battery voltage measurement section 31 of the present invention is not limited to such switches 314. Two or more switches may be serially connected to the switch 312. In this case, when the switches 314 are turned off and designated switches 311 and the switch 312 serially connected thereto are turned on so as to store a battery voltage of a designated battery block 21 in the capacitor 313, the voltage of up to DC 400 V of the battery pack 2 is divided by parasitic capacitance of the plurality of serially connected switches (only one switch 314 in the above-described example) and is applied to each of the switches 314, so that each voltage applied to the plurality of switches 314 can be lowered. Although the number of the switches 314 is increased, small-sized inexpensive switches only required to withstand a voltage which is lower than that conventionally-required to be withstood can be used as the switches 314. In this case, an IC chip including the plurality of switches 314 (only one switch 314 in the above-described example) can be manufactured using a conventional IC process.

The above example of the present invention has described the case where the circuit of the voltage measurement section 31 has a structure which can be divided into two circuit groups (upper and lower circuit groups) at the output terminal 21a of the battery pack 2 from which a voltage of DC 200 V (i.e., the midpoint of a voltage of up to DC 400 V) is output. However, the present invention is not limited to such a circuit. The circuit of the voltage measurement section 31 may be divided into three circuit groups (upper, middle, and lower circuit groups) or may be divided into N circuit groups, where N is an integer equal to or more than three. Whatever the number of the circuit groups is, the effects of the voltage division can be attained using a circuit which includes the serially-connected switches according to the present invention, and a voltage which switches used in such a circuit are required to withstand can be lowered. Although, in the example of the present invention where the circuit of the voltage measurement section 31 is divided into two circuit groups (upper and lower circuit groups), there are provided in the voltage measurement section 31 two voltage measurement circuits each including the capacitor 313, the switches 314, the differential amplifier 315, and the A/D converter 316, when the circuit of the voltage measurement section 31 is divided into three circuit groups (upper, middle, and lower circuit groups), three voltage measurement circuits as described above are provided in the voltage measurement section 31. Accordingly, when the circuit is divided in to N circuit groups, N voltage measurement circuits as described above are provided in the voltage measurement section 31. In such a case, the switches 312 serially connected to the switches 311 may be provided in all of the circuit groups divided by N, but may not be provided in a divided circuit group to which a low voltage is applied.

Although in the above example of the present invention, only the upper circuit group of FIG. 2 is described, the lower circuit group can attain similar effects to those of the upper circuit group. That is, the lower circuit group of the voltage measurement section 31 includes diodes 319a and 319b (rectifier sections) used as overvoltage prevention sections for preventing a voltage from being excessive, and the diodes 319a and 319b are connected to a pair of conductor lines 321a and 321b, respectively, which are laid between the switches 311 and the switches 320, in a forward direction from two output terminals 21a of the designated battery block 21. The lower circuit group may receive a voltage of approximately DC 200 V which is a half of the divided voltage of up to approximately DC 400 V of the battery pack 2. The diodes 318a and 318b used as the overvoltage prevention sections are connected to a battery block 21 (an output terminal 21a) to which a lowest switch 311 provided in the upper circuit group of the divided circuit structure of the voltage measurement section 31 is connected. The diodes 319a and 319b used as the overvoltage prevention sections are connected to a battery block 21 (an output terminal 21a) to which a lowest switch 311 provided in the lower circuit group of the divided circuit structure of the voltage measurement section 31 is connected.

A battery voltage measurement device according to the present invention may include both of the battery pack 2 and the voltage measurement section 31 or may include only the voltage measurement section 31 without including the battery pack 2.

As described above, according to the present invention, by providing the series circuit in which the plurality of the first switching sections connected in parallel to one another are connected to the second switching sections, the voltage of up to approximately DC 400 V applied to the first and second switching sections being in an off state, is applied to the first and second switching sections as voltages divided by the respective parasitic capacitance of the first and second switching sections being in an off state, so that the voltage applied to the first and second switching section can be lowered. Thus, small-sized inexpensive switches only required to withstand a voltage which is lower than that conventionally-required to withstand can be used as the first and second switching sections.

According to the present invention, by providing the series circuit in which the first switching sections are connected to the second switching sections, in the case where a battery voltage of a designated battery block is stored in a capacitor section and thereafter all of the first and second switching sections are turned off, at the time of measuring the battery voltage, when the third switching sections are turned on, a voltage of up to approximately DC 400 V of a battery pack is divided by parasitic capacitance of the first and second switching sections being in an off state and is applied to the first and second switching sections, so that the voltage applied to the plurality of first and second switching sections can be lowered. Thus, small-sized inexpensive switches only required to withstand a voltage which is lower than that conventionally-required to be withstood can be used as the first and second switching sections.

According to the present invention, by providing the switching sections including a plurality of serially-connected switches, when the third switching sections are turned off and the designated first switching sections and the second switching sections serially connected thereto are turned on so as to store a battery voltage of a designated battery block in the capacitor section, the voltage of up to approximately DC 400 V of the battery pack is divided by parasitic capacitance of the plurality of serially-connected switches (the third switching sections) and is applied to each of the third switching sections, so that each voltage applied to the plurality of serially-connected switches (the third switching sections) can be lowered. Thus, small-sized inexpensive switches only required to withstand a voltage which is lower than that conventionally-required to be withstood can be used as the third switching sections.

According to the present invention, by using a plurality of serially-connected switches as the second switching section, a voltage stored in the capacitance section is divided by parasitic capacitance of the plurality of serially-connected switches and is applied to each of the plurality of serially-connected switches. Thus, small-sized inexpensive switches only required to withstand a voltage which is lower than that conventionally-required to be withstood can be used as the first and second switching sections.

According to the present invention, when the relationship between the parasitic capacitance of groups of switches is represented by Cb<Ca, since the number of the first switching sections is considerably greater than that of the second switching sections, a voltage applied to the first switching sections can be lower than that applied to the second switching sections, whereby it is possible to lower a voltage withstanding requirement of the first switching sections, the number of which is greater than that of the second switching sections.

According to the present invention, a voltage is applied from an output terminal of a designated battery block to a pair of conductor lines laid between serially-connected switches, so that a voltage clamp function of the rectifier sections which prevents a voltage from being excessive with respect to a voltage withstanding requirement of the switches is attained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A battery voltage measurement device comprising:
   a plurality of first switching sections, wherein each pair of adjacent first switching sections sequentially selects two output terminals of each of a plurality of battery blocks included in a battery pack so that each of the selected output terminals reconnected to one of a pair of conductor wires;
   a voltage detection section for detecting a battery voltage of each of the plurality of battery blocks via the pair of conductor wires;

second switch sections each being provided on a respective one of the pair of conductor lines and being serially connected to each group of the plurality of first switch sections connected in parallel to one of the pair of conductor lines;

a capacitance section laid between the pair of conductor lines for selectively storing a battery voltage of each of the battery blocks via the first and second switching sections; and a third switching section for selectively applying the battery voltage stored in the capacitance section to the voltage detection section, wherein
the voltage detection section detects the battery voltage stored in the capacitance section via the third switching section.

2. A battery voltage measurement device according to claim 1, wherein the third switching section includes a plurality of serially-connected switching sections.

3. A battery voltage measurement device according to claim 1, wherein the second switching section includes a plurality of serially-connected switching sections.

4. A battery voltage measurement device according to claim 1, wherein a relationship between a parasitic capacitance Ca of the plurality of first switching sections connected in parallel to the pair of conductor lines and a parasitic capacitance Cb of the second switching sections is represented by $Ca \geq Cb$.

5. A battery voltage measurement device according to claim 1, further comprising overvoltage prevention sections each being connected to a respective one of the pair of conductor lines, which serially connect the first switching sections to second switching sections, in a forward direction from two output terminals of a designated battery block.

6. A battery voltage measurement device comprising:

a battery pack including a plurality of battery blocks;

a plurality of first switching sections, wherein each pair of adjacent first switching sections sequentially selects two output terminals of each of the plurality of battery blocks so that each of the selected output terminals are connected to a respective one of a pair of conductor wires;

a voltage detection section for detecting a battery voltage of each of the plurality of battery blocks via the pair of conductor wires;

second switch sections each being provided on a respective one of the pair of conductor lines and being serially connected to each group of the plurality of first switch sections connected in parallel to one of the pair of conductor lines;

a capacitance section laid between the pair of conductor lines for selectively storing a battery voltage of each of the battery blocks via the first and second switching sections; and a third switching section for selectively applying the battery voltage stored in the capacitance section to the voltage detection section, wherein
the voltage detection section detects the batter voltage stored in the capacitance section via the third switching section.

7. A battery voltage measurement device according to claim 6, wherein the third switching section includes a plurality of serially-connected switching sections.

8. A battery voltage measurement device according to claim 6, wherein the second switching section includes a plurality of serially-connected switching sections.

9. A battery voltage measurement device according to claim 6, wherein a relationship between a parasitic capacitance Ca of the plurality f first switching sections connected in parallel to the pair of conductor lines and a parasitic capacitance Cb of the second switching sections is represented by $Ca \geq Cb$.

10. A battery voltage measurement device according to claim 6, further comprising overvoltage prevention sections each being connect d to a respective one of the pair of conductor lines, which serially connect the first switching sections to the second switching sections, in a forward direction from two output terminals of a designated battery block.

* * * * *